United States Patent [19]
Boerstler

[11] Patent Number: 5,774,511
[45] Date of Patent: Jun. 30, 1998

[54] PROCESSOR CLOCK CIRCUIT

[75] Inventor: David William Boerstler, Round Rock, Tex.

[73] Assignee: International Business Machines Corporation, Armonk, N.Y.

[21] Appl. No.: 635,103

[22] Filed: Apr. 19, 1996

[51] Int. Cl.[6] ..................................................... H03D 3/00
[52] U.S. Cl. .......................... 375/376; 327/291; 331/1 A; 375/327
[58] Field of Search .................................. 375/376, 327; 331/1 A, 14, 18, 25; 327/291, 105; 455/75, 76

[56] References Cited

U.S. PATENT DOCUMENTS

| | | | |
|---|---|---|---|
| 4,215,430 | 7/1980 | Johnson, Jr. .............................. | 375/376 |
| 5,155,451 | 10/1992 | Gladden et al. ......................... | 331/1 A |
| 5,184,350 | 2/1993 | Dara ........................................ | 375/376 |
| 5,230,013 | 7/1993 | Hanke et al. ............................ | 375/376 |
| 5,256,980 | 10/1993 | Itri ........................................... | 327/105 |
| 5,258,877 | 11/1993 | Leake et al. ............................. | 375/376 |
| 5,260,979 | 11/1993 | Parker et al. ............................ | 375/376 |
| 5,487,093 | 1/1996 | Andersen et al. ....................... | 375/376 |
| 5,577,074 | 11/1996 | Roos et al. .............................. | 375/327 |

OTHER PUBLICATIONS

A Wide–Bandwidth Low–Voltage PLL for PowerPC Micro., by Alvarez et al, Member, IEEE pp. 383–391, Apr. 1995.
Jose Alvarez, et al., "A Wide–Bandwidth Low–Voltage PLL for Power PC™ Microprocessors," *IEEE Journal of Solid–State Circuits*, vol. 30, No. 4, Apr.,1995, pp. 383–391.
Ian A. Young, et al., "A PLL Clock Generator with 5 to 110 MHz of Lock Range for Microprocessors," *IEEE Journal of Solid–State Circuits*, vol. 27, No. 11, Nov., 1992, pp. 1599–1607.

*Primary Examiner*—Stephen Chin
*Assistant Examiner*—Joseph Roundtree
*Attorney, Agent, or Firm*—Kelly K. Kordzik; Winstead Sechrest & Minick P.C.; Anthony V. S. England

[57] ABSTRACT

Within a microprocessor, multiple synchronous clock signals of arbitrary integer and non-integer ratios are produced with conventional digital divider circuitry. The various integer and non-integer clock signals can be provided to processor circuitry, bus circuitry, and coupled memory circuitry. Non-integer ratio clock signals can be produced out-of-phase with the system clock signal.

9 Claims, 3 Drawing Sheets

PROCESSOR CLOCK CIRCUIT

TECHNICAL FIELD

The present invention relates in general to data processing systems, and in particular, to a clock circuit for generating multiple synchronous clock signals having integer and non-integer ratios.

BACKGROUND INFORMATION

A microprocessor (hereinafter also referred to as a "processor" or a "CPU" (central processing system)) within a data processing system is comprised of various groups of logic circuitry, execution units, latches, etc. designed to perform a multitude of functions in a coordinated manner. In order to maintain this coordination and ensure the accuracy of the results produced by a microprocessor, clock signals are utilized to synchronize the timing of all of the various operations within the microprocessor.

A clock circuit in a computer generates a steady stream of timing pulses—the digital signals that synchronize every operation. The clock rate(s) of a data processing system is one of the prime determinants of its overall processing speed and performance.

Microprocessors often require multiple synchronous clock signals for such items as the logic circuitry, memory circuitry, and bus interfaces. The frequency of the processor clock and the memory clock are usually different from each other and from the bus clock, and are dictated by the particular design of the processor, the system in which it is used, the application, the technology, and other factors.

Non-integer clock ratios (for example, 1.5, 2.5 or 2.2 times the reference clock signal, which is often the system clock signal) are important for reducing the incremental performance granularity normally taken for integer ratios. However, current techniques for producing such non-integer clock ratios use clock choppers and are imprecise and add additional jitter and skew to the resultant clock signal, which reduces the microprocessor performance. Such a prior art clock circuit for producing a non-integer ratio clock signal is disclosed in J. Alvarez, et al., *A Wide Band-Width Low-Voltage PLL for PowerPC® Microprocessors*, IEEE JSSC, Vol. 30, No. 4, pp. 383–391, April 1995, which is hereby incorporated by reference herein. However, the disclosed solution in this reference has skew introduced by asymmetric structures in the phase locked loop ("PLL") circuit which require compensation by imperfectly matched circuits.

Thus, there is a need in the art for clock circuitry capable of producing non-integer ratio clock signals, which does not require the use of clock choppers and does not add additional jitter and skew to the resultant clock signals.

SUMMARY OF THE INVENTION

The present invention solves the foregoing need by using a plurality of conventional divider circuits in various configurations within the microprocessor PLL circuit. In one such configuration, a divider circuit is coupled between the input providing the system clock to the microprocessor and the phase/frequency detector circuit, and a second divider circuit is implemented within the feedback loop in the PLL circuit. The output frequency from the PLL circuit is therefore proportional to the ratio of the two divider circuits, which can be set to be a non-integer ratio.

In an alternative embodiment of the present invention, further divider circuits may be utilized with parallel outputs from the PLL circuit to provide a multitude of integer and non-integer ratio clock signals from the same PLL circuit.

In yet another alternative embodiment of the present invention, additional clock phases, such as a quadrature clock phase, may be generated using the present invention.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWING

For a more complete understanding of the present invention, and the advantages thereof, reference is now made to the following descriptions taken in conjunction with the accompanying drawings, in which.

DETAILED DESCRIPTION

Figure 1:
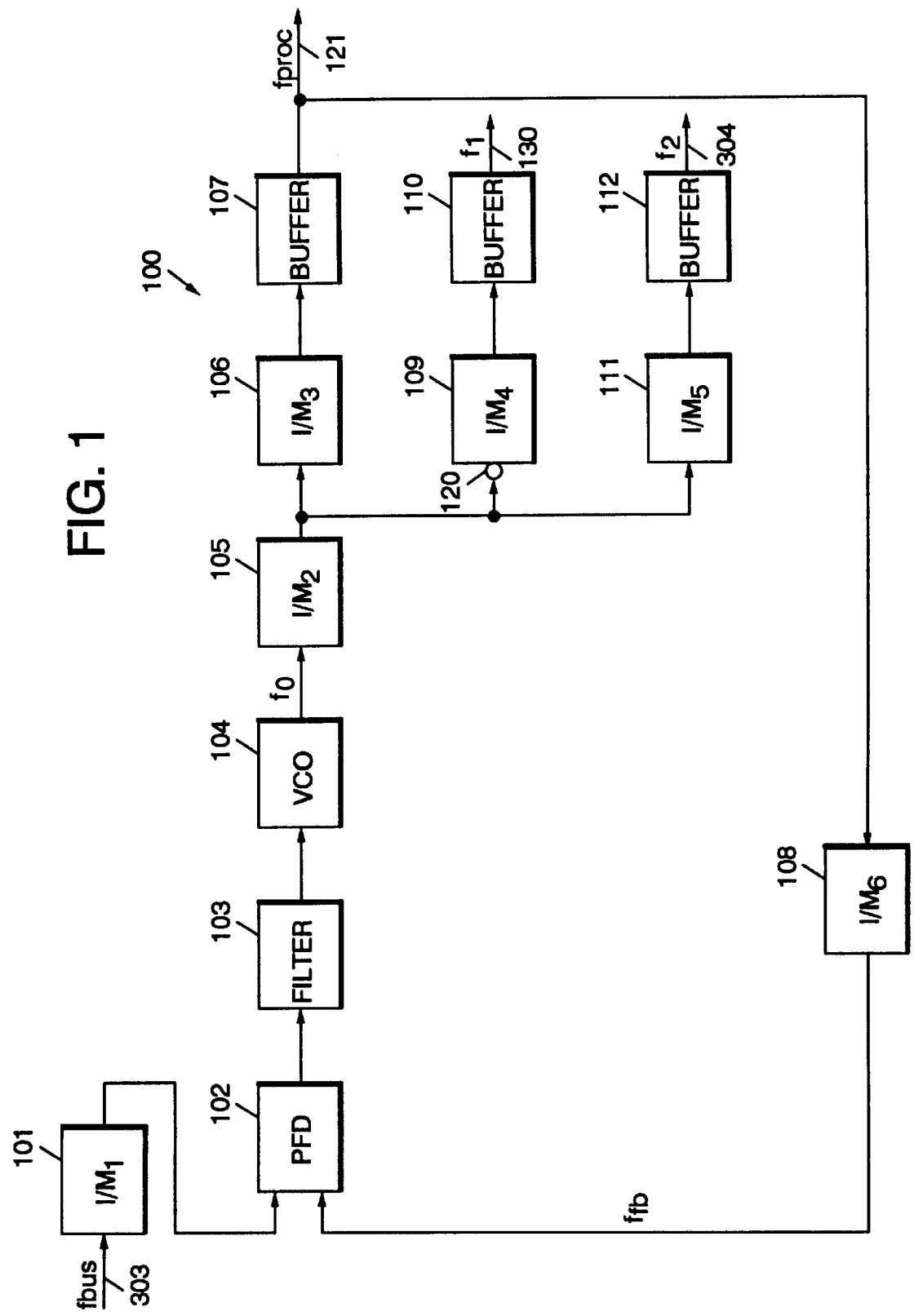
FIG. 1 illustrates one embodiment of the PLL circuit of the present invention.

In the following description, numerous specific details are set forth such as specific frequency ratios, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Referring to FIG. 1, there is illustrated PLL circuit 100 configured in accordance with one embodiment of the present invention. PLL circuit 100 displays one technique for generating multiple synchronous clocks for a microprocessor at both integer and non-integer multiples of the system bus clock received on transmission line 303, and labeled as having a frequency $f_{bus}$ (also referred to herein as frequency F1). Clock signal $f_{bus}$ is received by divider circuit 101, which may be comprised of a conventional digital divider circuit. A conventional digital divider circuit may consist of a binary counter, usually synchronous, which counts a number of pulses before its output switches. These counters may be fashioned from flip-flops, latches, or shift registers, and may contain combinational circuits. Usually, such conventional digital divider circuits are sensitive to one edge of the input clock signal (e.g., the rising transition). The divide ratio of divider circuit 101 is shown as $M_1$, wherein $M_1$ is a positive integer value (the frequency of the clock signal output from divider circuit 101 is $f_{bus}/M_1$).

This divided clock signal is input into phase/frequency detector ("PFD") circuit 102, which also receives a feedback signal having frequency $f_{fb}$ output from conventional divider circuit 108, whose output clock signal has a frequency $f_{fb}=f_{proc}/M_6$ (frequency $f_{proc}$ is also referred to herein as frequency F2). At equilibrium, PLL circuit 100 will force the phase and frequency of the two received signals into PFD circuit 102 to be equal. The output clock signal of PFD circuit 102 is input into filter circuit 103, which may comprise any well-known filter circuit used within PLL circuits. Note, though a charge pump circuit is not shown as being included within circuit 100, such a charge pump circuit could be added as a separate circuit or as a part of PFD circuit 102 or filter circuit 103.

The output clock signal of filter circuit 103 is input into voltage controlled oscillator ("VCO") circuit 104, which produces an output clock signal having a frequency $f_o$. This clock signal is input into divider circuit 105, whose divide ratio is indicated as being $M_2$, wherein $M_2$ is a positive integer.

The output clock signal of divider circuit 105 (having a frequency equal to $f_o/M_2$) is provided in parallel to divider circuits 106, 109, and 111. Note, the output of divider circuit 105 could be provided to any number of parallel-arranged divider circuits.

Divider circuit 106 has a divide ratio indicated by $M_3$. Divider circuit 109 has a divide ratio indicated by $M_4$. Divider circuit 111 has a divide ratio indicated by $M_5$. $M_3$, $M_4$ and $M_5$ are all positive integer values. Divider circuits 105, 106, 109, and 111 may also be conventional digital divider circuits.

Optional buffer circuits 107, 110, and 112 are inserted at the output of divider circuits 106, 109, and 111, respectively.

Divider circuit 109 includes inverter circuit 120 at its input. Inversion may be performed by phase reversal if differential signaling is used. This is a preferred method as no additional skew is added. Inverter circuit 120 operates to modify the phase of the clock signal produced at the output of divider circuit 109 by 90° (relative to the clock signal output from divider circuit 106, which has a phase equal to the phase of $f_{bus}$ and $f_{proc}$), thus producing a quadrature clock signal.

The output of buffer circuit 107 may be the clock signal provided to the remainder of microprocessor 310 (see FIG. 3), and has a frequency $f_{proc}$, and is delivered on transmission line 121. Additionally, this clock signal is fed back to PFD circuit 102 through divider circuit 108, which has a divide ratio of $M_6$, wherein $M_6$ is a positive integer.

The output of buffer 110 is a clock signal having a frequency $f_1$ on transmission line 130. The output of buffer 112 is a clock signal having a frequency $f_2$, provided on transmission line 304.

Since $f_{fb}=f_{bus}/M_1=f_{proc}/M_6$, then $f_{proc}/f_{bus}=M_6/M_1$. Since $f_o/M_2=f_{proc}*M_3=f_2*M_5=f_1*M_4$, then $f_{proc}/f_2=M_5/M_3$ and $f_{proc}/f_1=M_4/M_3$. Therefore, $f_{proc}=f_{fb}*M_6$, $f_{proc}=f_o(M_2\ M_3)$, $f_1=f_o/(M_2\ M_4)$, and $f_2=f_o/(M_2\ M_5)$.

As noted above, the divider ratio values $M_1, M_2, \ldots M_6$ are conventional integer divider values, which when used in this invention can produce non-integer clock multiplication (a divider circuit may include prescalars for generality). Additionally, VCO 104 may be operated at a higher frequency than $f_{proc}$ for ease of integration (requiring fewer circuits in a ring oscillator) and for improved duty-cycle from subsequent frequency division.

Furthermore, as noted above, additional clock phases (for example, quadrature) may be created by appropriate inversions as shown for the production of clock signal $f_1$. A high degree of independence between the clock ratios may be achieved between the clock signals provided for processor 310, system bus 312, and any external memory devices, such as L2 (secondary) cache 301 (see FIG. 3). For example, $f_1$ may be used within CPU 310 for a mid-cycle clock boundary and $f_2$ may be a clock signal for L2 cache 301.

As an example, let $M_1=2$, $M_2=1$, $M_3=2$, and $M_4=2$. These values are fixed. Additionally, let $M_5$ and $M_6$ be divider ratio values selectable between 2 and 10. Then, both the $f_{proc}$-to-$f_{bus}$ and $f_{proc}$-to-$f_2$ ratios may be independently set to integer ratios of 1, 2, 3, 4, or 5 and non-integer ratios of 1.5, 2.5, 3.5, or 4.5. Allowing $M_4=M_3$ creates a quadrature clock of $f_{proc}$ at $f_1$, and not merely a delayed version of $f_{proc}$.

Divider circuit 105 may be used for increasing frequency $f_o$ produced by VCO 104.

Matching $M_6$ and $M_1$ minimizes the phase error between $f_{proc}$ at the point of use and $f_{bus}$. Matching techniques can be used similarly for other dividers and buffer circuits 107, 110, and 112 to minimize skew.

Figure 2:
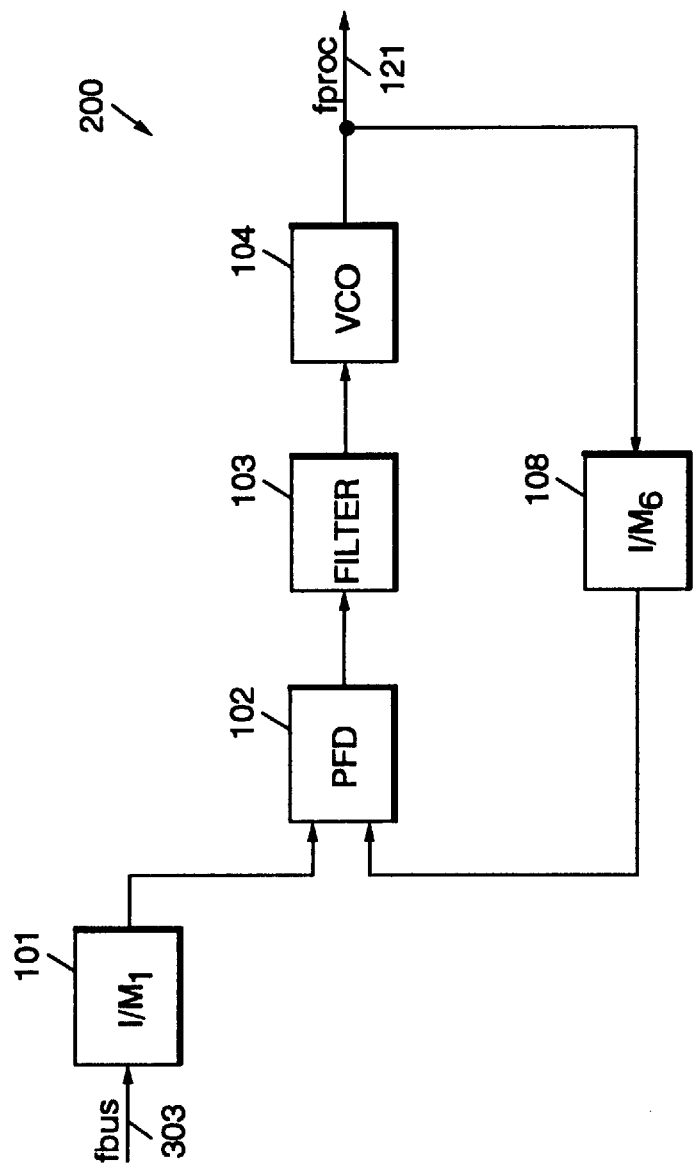
FIG. 2 illustrates an alternative embodiment of the present invention.

Referring next to FIG. 2, there is illustrated a more simplified version of PLL circuit 100 labeled as PLL circuit 200. Essentially, divider circuits 105, 106, 109, 111 and buffer circuits 107, 110, 112 have been deleted. Nevertheless, the clock signal having frequency $f_{proc}$ can still have a non-integer ratio of the input clock frequency $f_{bus}$, since $f_{proc}=f_{bus}(M_6/M_1)$. For example, if $M_1=7$, and $M_6=3$, then the clock frequency output on transmission line 121 will have a frequency $f_{proc}=3/7$.

Figure 3:
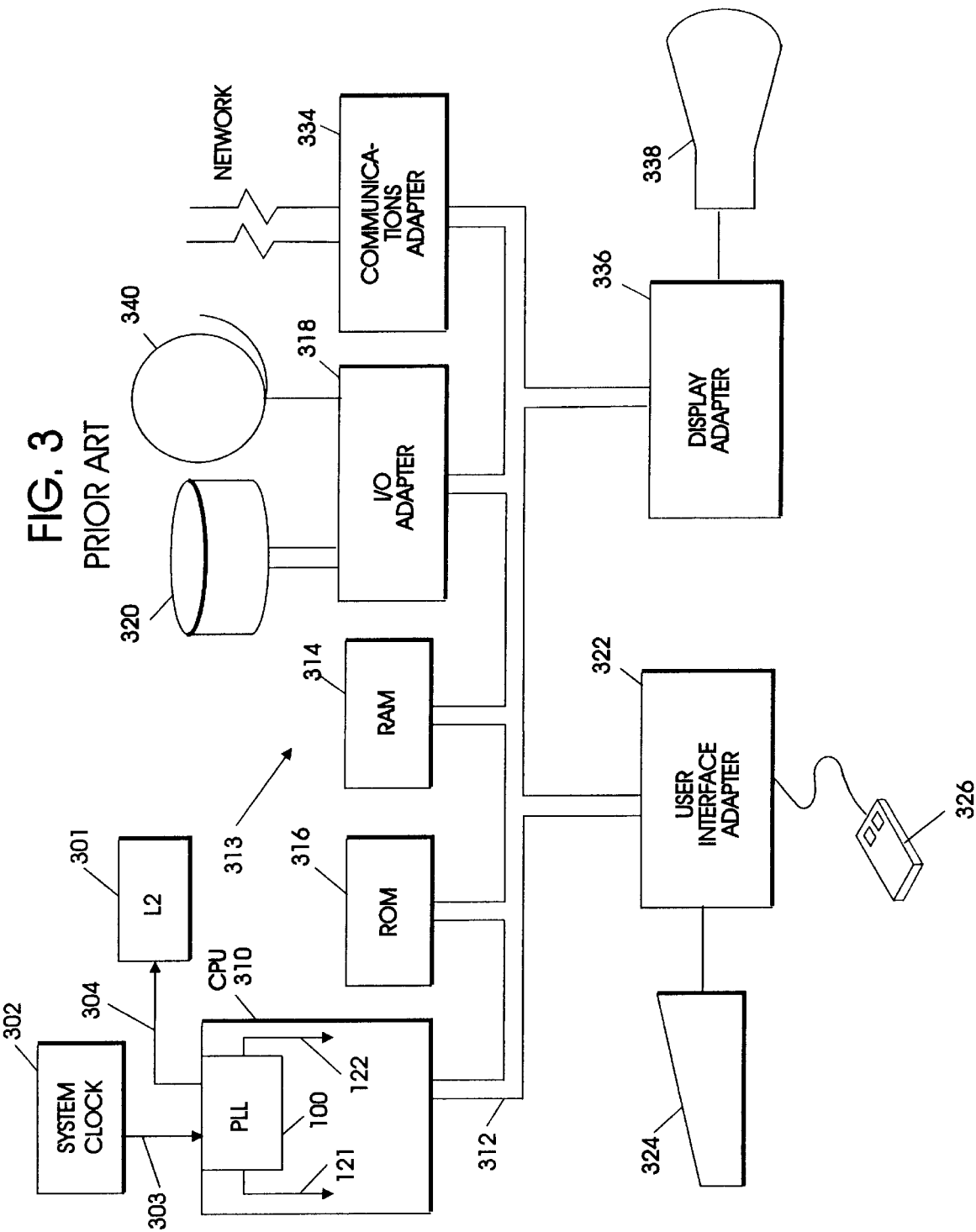
FIG. 3 illustrates a data processing system configured in accordance with the present invention.

A representative hardware environment for practicing the present invention is depicted in FIG. 3, which illustrates a typical hardware configuration of workstation 313 in accordance with the subject invention having central processing unit (CPU) 310, such as a conventional microprocessor, and a number of other units interconnected via system bus 312. Workstation shown in FIG. 3 includes random access memory (RAM) 314, read only memory (ROM) 316, and input/output (I/O) adapter 318 for connecting peripheral devices such as disk units 320 and tape drives 340 to bus 312, user interface adapter 322 for connecting keyboard 324, mouse 326, and/or other user interface devices such as a touch screen device (not shown) to bus 312, communication adapter 334 for connecting the workstation to a data processing network, and display adapter 336 for connecting bus 312 to display device 338. CPU 310 may include other circuitry not shown herein, which will include circuitry commonly found within a microprocessor, e.g., execution unit, bus interface unit, arithmetic logic unit, etc. CPU 310 may also reside on a single integrated circuit.

As can be seen, CPU 310 includes PLL circuit 100, and receives the system clock signal having frequency $f_{bus}$ on transmission line 303 from system clock source 302. CPU 310 is coupled to L2 cache 301, which receives a clock signal having frequency $f_2$ on transmission line 304 from PLL circuit 100. Clock signals having frequencies $f_{proc}$ and $f_1$ may be routed to CPU 310, and $f_{bus}$ routed to system bus 312, respectively, on lines 121, 122, and 130, respectively.

PLL 200 could also be implemented on an IC with CPU 310.

Although the present invention and its advantages have been described in detail, it should be understood that various changes, substitutions and alterations can be made herein without departing from the spirit and scope of the invention as defined by the appended claims.

What is claimed is:

1. A circuit for generating one or more clock signals, the circuit comprising:

a first divider circuit receiving a reference clock signal having a frequency F1, wherein the first divider circuit has a first divide ratio M1;

a phase locked loop ("PLL") circuit coupled to the first divider circuit, wherein a feedback path of the PLL circuit includes a second divider circuit having a second divide ratio M6;

output circuitry, coupled to the PLL circuit, for outputting an output clock signal having a frequency F2=F1*M6/M1, wherein M1 and M6 are positive integers;

a third divider circuit coupled to the PLL circuit, wherein the third divider circuit has a third divide ratio M5, and wherein an output of the third divider circuit has a frequency that is proportional to (M6*F1)/(M1*M5); and a fourth divider circuit coupled to the PLL circuit, the fourth divider circuit including an inverter circuit at its input so that the output of the fourth divider circuit is out of phase with the output of the third divider circuit, and wherein the output of the fourth divider circuit is synchronous with the output of the third divider circuit.

2. The circuit as recited in claim 1, wherein the output of the fourth divider circuit has a non-integer ratio frequency relative to F1.

3. A data processing system comprising:

a processor;

one or more storage devices;

one or more input or output devices; and a bus coupling the processor to the one or more storage devices and the one or more input or output devices, wherein the processor further comprises a clock circuit comprising:
  a first divider circuit receiving a reference clock signal having a frequency F1, wherein the first divider circuit has a first divide ratio M1;
  a phase locked loop ("PLL") circuit coupled to the first divider circuit, wherein a feedback path of the PLL circuit includes a second divider circuit having a second divide ratio M6; and
  output circuitry, coupled to the PLL circuit, for outputting an output clock signal for use by the processor having a frequency F2=F1*M6/M1, wherein M1 and M6 are positive integers.

4. The circuit as recited in claim 3, wherein the output clock signal has a non-integer ratio, wherein M6/M1 is a non-integer, wherein the first and second divider circuits are conventional digital dividers.

5. The circuit as recited in claim 3, further comprising:
a third divider circuit coupled to the PLL circuit, wherein the third divider circuit has a third divide ratio M5, and wherein an output of the third divider circuit has a frequency that is proportional to (M6*F1)/(M1*M5).

6. The circuit as recited in claim 3, further comprising:
a third divider circuit coupled to the output circuitry and having an output coupled to an input of the second divider circuit, wherein the third divider circuit has a third divide ratio of M3, and wherein the output of the third divider circuit has a frequency that is proportional to (F1*M6)/M1.

7. The circuit as recited in claim 6, further comprising:
a fourth divider circuit coupled to the PLL circuit, wherein the fourth divider circuit has a fourth divide ratio M5, and wherein an output of the fourth divider circuit has a frequency that is proportional to (M6*M3*F1)/(M1*M5), wherein the fourth divider circuit includes an inverter circuit at its input so that the output of the fourth divider circuit is out of phase with the output clock signal, and wherein the output of the fourth divider circuit is synchronous with the output clock signal, wherein the output of the fourth divider circuit is a quadrature clock of the output clock signal, wherein the output of the fourth divider circuit has a non-integer ratio frequency relative to F1.

8. The circuit as recited in claim 5, wherein the output of the third divider circuit has a non-integer ratio frequency relative to F1, and wherein the output of the third divider circuit is provided to a secondary cache coupled to the processor, and wherein the output of the third divider circuit is synchronous with the output clock signal.

9. A processor including a clock circuit comprising:
  a first divider circuit receiving a reference clock signal having a frequency F1, wherein the first divider circuit has a first divide ratio M1;
  a phase locked loop ("PLL") circuit coupled to the first divider circuit, wherein a feedback path of the PLL circuit includes a second divider circuit having a second divide ratio M6;
  output circuitry, coupled to the PLL circuit, for outputting an output clock signal having a frequency F2=F1*M6/M1, wherein M1 and M6 are positive integers, wherein the output clock signal has a non-integer ratio, and wherein the PLL circuit comprises:
    a phase/frequency detector ("PFD") circuit receiving an output of the first divider circuit and an output of the second divider circuit, wherein at equilibrium a phase and frequency of the outputs from the first and second divider circuits are equal;
    a filter coupled to an output of the PFD circuit; and
    a voltage controlled oscillator ("VCO") coupled to an output of the filter, wherein an output of the VCO is coupled to the output circuitry and to an input of the second divider circuit;
  a third divider circuit coupled to the PLL circuit, wherein the third divider circuit has a third divide ratio M5;
  a fourth divider circuit coupled to the output circuitry and having an output coupled to an input of the second divider circuit, wherein the fourth divider circuit has a fourth divide ratio of M3, and wherein the output of the third divider circuit has a frequency that is proportional to (M6*M3*F1)/(M1*M5), wherein the output of the third divider circuit has a non-integer ratio frequency relative to F1, and wherein the output of the third divider circuit is synchronous with the output clock signal, and wherein the first, second, third, and fourth divider circuits are conventional digital dividers; and
  a fifth divider circuit coupled to the PLL circuit, the fifth divider circuit including an inverter circuit at its input so that the output of the fifth divider circuit is out of phase with the output of the fourth divider circuit, the fifth divider circuit having a fifth divide ratio M4, and wherein the output of the fifth divider circuit is synchronous with the output of the fourth divider circuit.

* * * * *